(12) United States Patent
Priewasser et al.

(10) Patent No.: US 10,727,128 B2
(45) Date of Patent: Jul. 28, 2020

(54) METHOD OF PROCESSING A WAFER

(71) Applicant: DISCO Corporation, Tokyo (JP)

(72) Inventors: Karl Heinz Priewasser, Munich (DE); Roland Zimmermann, Munich (DE); Hitoshi Hoshino, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/266,682

(22) Filed: Feb. 4, 2019

(65) Prior Publication Data

US 2019/0252254 A1 Aug. 15, 2019

(30) Foreign Application Priority Data

Feb. 14, 2018 (DE) .................. 10 2018 202 254

(51) Int. Cl.
| | | |
|---|---|---|
| *H01L 21/78* | (2006.01) | |
| *B23K 26/40* | (2014.01) | |
| *H01L 21/683* | (2006.01) | |
| *H01L 21/304* | (2006.01) | |
| *H01L 21/67* | (2006.01) | |
| *B23K 101/40* | (2006.01) | |

(52) U.S. Cl.
CPC ............ *H01L 21/78* (2013.01); *B23K 26/40* (2013.01); *H01L 21/304* (2013.01); *H01L 21/67132* (2013.01); *H01L 21/6836* (2013.01); *B23K 2101/40* (2018.08); *H01L 2221/68331* (2013.01)

(58) Field of Classification Search
CPC . H01L 21/78; H01L 21/304; H01L 21/67132; H01L 21/6835
USPC ....................................... 438/460
See application file for complete search history.

(56) References Cited

U.S. PATENT DOCUMENTS

| | | | |
|---|---|---|---|
| 2011/0065238 A1 | 3/2011 | Chiou et al. | |
| 2016/0079303 A1 | 3/2016 | Takyu et al. | |
| 2016/0358898 A1* | 12/2016 | Zhou | .................. H01L 25/0657 |
| 2017/0062278 A1 | 3/2017 | Priewasser | |

FOREIGN PATENT DOCUMENTS

| | | |
|---|---|---|
| CN | 104241094 A | 12/2014 |
| JP | 2005109433 A | 4/2005 |
| JP | 2006156567 A | 6/2006 |
| JP | 2013243223 A | 12/2013 |
| JP | 2017034128 A | 2/2017 |
| TW | 200524024 A | 7/2005 |
| TW | 201539562 A | 10/2015 |
| TW | 201705255 A | 2/2017 |
| WO | 2017036512 A1 | 3/2017 |
| WO | 2018002035 A2 | 1/2018 |

* cited by examiner

*Primary Examiner* — Elias Ullah

(74) *Attorney, Agent, or Firm* — Greer Burns & Crain Ltd.

(57) ABSTRACT

A method of processing a wafer having on one side a device area with a plurality of devices includes providing a protective film and applying the protective film to the device side of the wafer or to the other side of the wafer, so that at least a central area of a front surface of the protective film is in direct contact with the device side or the other side of the wafer. The protective film is attached to the device side or to other side of the wafer, so that at least a part of a peripheral portion of the protective film is attached to at least a part of a lateral edge of the wafer along the entire circumference of the wafer. The lateral edge of the wafer extends from the device side of the wafer to the other side of the wafer.

10 Claims, 5 Drawing Sheets

METHOD OF PROCESSING A WAFER

TECHNICAL FIELD

The present invention relates to a method of processing a wafer, such as a semiconductor wafer, having on one side a device area with a plurality of devices.

TECHNICAL BACKGROUND

In a semiconductor device fabrication process, a wafer having a device area with a plurality of devices, commonly partitioned by a plurality of division lines, is divided into individual dies. This fabrication process generally comprises a grinding step for adjusting the wafer thickness and a cutting step of cutting the wafer along the division lines to obtain the individual dies. The grinding step is performed from a back side of the wafer which is opposite to a wafer front side on which the device area is formed. Moreover, also other processing steps, such as polishing and/or etching, may be carried out on the back side of the wafer. The wafer may be cut along the division lines from its front side or its back side.

In order to protect the wafer back side or front side, in particular, the devices formed in the device area, e.g., from breakage, deformation and/or contamination by debris, grinding water or cutting water, during processing of the wafer, a protective film or sheeting may be applied to the back side or front side of the wafer prior to processing.

Such protection of the wafer back side or front side, in particular, the devices, is especially important if the respective side of the wafer, e.g., the device area, has an uneven surface structure.

For example, in known semiconductor device fabrication processes, such as Wafer Level Chip Scale Package (WLCSP), the device area of the wafer is formed with a plurality of protrusions, such as bumps, protruding from a plane surface of the wafer. These protrusions are used, for example, for establishing an electrical contact with the devices in the individual dies, e.g., when incorporating the dies in electronic equipment, such as mobile phones and personal computers.

Further, in known wafers, the devices in the device area may protrude from a plane wafer surface. The division lines partitioning these devices may form at least slight grooves or trenches between the devices, thus resulting in an uneven surface profile.

In a conventionally known dicing before grinding process, a wafer is first partially cut along the division lines from its front side along only a part of the thickness of the wafer. Subsequently, the wafer back side is ground along a remaining part of the wafer thickness in which the wafer had not been cut, so as to divide the wafer along the division lines in separate chips or dies. Also such partial cuts introduce a surface profile which renders the wafer front side uneven.

When attaching a protective film or sheeting to such an uneven wafer surface in a conventional manner, problems arise in that, e.g., due to the presence of grooves, trenches or protrusions, the surface is not efficiently protected. In particular, the protective film may not reliably seal the wafer surface at a peripheral wafer portion, allowing contaminants, such as debris, grinding water or cutting water, to enter and contaminate the surface.

In order to achieve a size reduction of electronic equipment, such as mobile phones and personal computers, semiconductor devices have to be reduced in size. Hence, wafers having the devices formed thereon are ground in the grinding step referred to above to thicknesses in the μm range, e.g., in the range from 20 to 100 μm. Desirably, such grinding processes are performed at high speed, so as to improve the wafer processing efficiency.

In known semiconductor device fabrication processes, problems may arise during the process of grinding wafers to such small thicknesses, in particular, at high speed. Specifically, the grinding process may cause the formation of sharp wafer edges which act as starting points for wafer chipping and breakage, thus significantly affecting the quality of the resulting chips or dies. Further, equipment used for dividing the wafer after grinding, such as a blade or a saw, may be damaged due to being impacted by loose, small-sized chips arranged at the peripheral wafer portion. Such sharp wafer edges may also lead to problems in the storage and/or transport of ground wafers, e.g., damaging the containers in which they are received, such as wafer cassettes or the like.

In order to address the above-identified problems related to thin wafer grinding, it is known to perform an edge trimming process on the wafer front side prior to grinding the wafer. In this process, at least a part of the outer peripheral portion of the front side of the wafer is cut, so as to obtain a step portion, e.g., an annular step portion, along the wafer circumference. By providing such a step portion, the formation of a sharp wafer edge in the grinding step can be avoided. However, the requirement of an additional edge trimming step renders the wafer processing method more complicated and reduces the processing efficiency.

Hence, there remains a need for an efficient and reliable method of processing a wafer having a device area which allows for any risk of contamination and damage to the wafer to be minimised.

SUMMARY OF THE INVENTION

Accordingly, it is an object of the present invention to provide an efficient and reliable method of processing a wafer having a device area which allows for any risk of contamination and damage to the wafer to be minimised. This goal is achieved by a wafer processing method with the technical features of claim 1. Preferred embodiments of the invention follow from the dependent claims.

The invention provides a method of processing a wafer having on one side a device area with a plurality of devices. The method comprises providing a protective film and applying the protective film to the one side of the wafer or to the side of the wafer being opposite to the one side, so that at least a central area of a front surface of the protective film is in direct contact with the one side of the wafer or the side of the wafer being opposite to the one side. The method further comprises attaching the protective film to the one side of the wafer or to the side of the wafer being opposite to the one side, so that at least a part of a peripheral portion of the protective film is attached to at least a part of a lateral edge of the wafer along the entire circumference of the wafer, wherein the lateral edge of the wafer extends from the one side of the wafer to the side of the wafer being opposite to the one side. Moreover, the method comprises processing the one side of the wafer and/or the side of the wafer being opposite to the one side.

The protective film is applied to the one side of the wafer, i.e., to the wafer front side, or to the side of the wafer being opposite to the one side, i.e., to the wafer back side; so that at least the central area of the front surface of the protective film is in direct contact with the one side of the wafer or the side of the wafer being opposite to the one side. Thus, no material, in particular, no adhesive, is present between at least the central area of the front surface of the protective film and the one side of the wafer or the side of the wafer being opposite to the one side.

Therefore, the risk of a possible contamination of or damage to the wafer, e.g., due to an adhesive force of an adhesive layer or adhesive residues on the wafer, can be significantly reduced or even eliminated.

The lateral edge of the wafer extends from the one side of the wafer to the side of the wafer being opposite to the one side, i.e., from the wafer front side to the wafer back side. The lateral wafer edge thus forms a circumferential side surface of the wafer. The lateral wafer edge may have a substantially straight surface profile or a curved, in particular, radially outwardly curved, e.g., convex, surface profile. The lateral wafer edge extends from a surface plane of the wafer front side to a surface plane of the wafer back side. The lateral wafer edge comprises the peripheral wafer surface portions which have extension directions deviating from or intersecting the surface planes of the wafer front and back sides, such as, for example, radially outwardly curved peripheral wafer surface portions.

The surface of the side of the wafer to which the protective film is attached may be a substantially flat, even surface or a flat, even surface. Alternatively, protrusions or projections protruding from a plane wafer surface along the thickness direction of the wafer and/or recessed portions, such as grooves or trenches, may be present on the respective side of the wafer.

The protective film is attached to the one side of the wafer or to the side of the wafer being opposite to the one side, so that at least a part of a peripheral portion of the protective film is attached to at least a part of the lateral edge of the wafer along the entire circumference of the wafer. Therefore, the side of the wafer to which the protective film is applied is efficiently protected, especially from contamination, even in the presence of surface unevenness, such as grooves, trenches, protrusions or projections. In particular, since the at least a part of the peripheral portion of the protective film is attached to the at least a part of the lateral edge of the wafer along the entire circumference of the wafer, the protective film reliably seals the respective wafer surface at the peripheral wafer portion, preventing contaminants, such as debris, grinding water or cutting water, from entering and contaminating the wafer surface.

Further, the protective film reliably protects the peripheral wafer portion from damage, e.g., wafer chipping or breakage, in particular, during processing of the wafer front side and/or back side, such as back side grinding. Thus, for example, the wafer can be ground to small thicknesses at high speed, while minimising the risk of damage to the wafer. If a sharp wafer edge is formed during the grinding process, it is safely protected by the protective film. Hence, it can be reliably ensured that the wafer, the chips or dies resulting after division of the wafer, the equipment used for dividing the wafer and the equipment used for storing and/or transporting the wafer are not compromised in their integrity. No additional processing step, such as edge trimming the wafer prior to grinding, is required, so that a high processing efficiency can be achieved.

Hence, the invention provides an efficient and reliable method of processing a wafer having a device area which allows for any risk of contamination and damage to the wafer to be minimised.

After attaching the protective film to the wafer front side or back side, the wafer front side and/or the wafer back side may be processed.

The protective film may be attached to the wafer front side or back side so that the at least a part of the peripheral portion of the protective film is attached to the at least a part of the lateral edge of the wafer along 5% or more, 10% or more, 15% or more, 20% or more, 25% or more, or 30% or more of the thickness of the wafer, in particular, the thickness of the wafer before grinding.

The protective film may be attached to the wafer front side or back side so that the at least a part of the peripheral portion of the protective film is attached to the at least a part of the lateral edge of the wafer along 30% or less, 25% or less, 20% or less, 15% or less, 10% or less, or 5% or less of the thickness of the wafer, in particular, the thickness of the wafer before grinding.

Particularly preferably, the at least a part of the peripheral portion of the protective film is attached to the at least a part of the lateral edge of the wafer along a part of the thickness of the wafer, i.e., the wafer thickness before grinding, which is equal to or smaller than the thickness of the wafer to be obtained by grinding or by grinding and polishing, i.e., the wafer thickness after grinding or after grinding and polishing. In this way, it can be ensured that the grinding equipment, such as a grinding wheel, and the polishing equipment, if a polishing step if performed after grinding, do not come into contact with the protective film attached to the lateral wafer edge. Hence, any damage to this equipment, such as clogging of a grinding or polishing wheel, can be reliably prevented.

Attaching the protective film to the one side of the wafer or to the side of the wafer being opposite to the one side may comprise applying an external stimulus to the protective film during and/or after applying the protective film to the one side of the wafer or to the side of the wafer being opposite to the one side. In this case, an attachment force between protective film and wafer, holding the protective film in its position on the wafer, is generated through the application of the external stimulus. Hence, no additional adhesive material is necessary for attaching the protective film to the one side of the wafer or the side of the wafer being opposite to the one side.

In particular, by applying the external stimulus to the protective film, a form fit, such as a positive fit, and/or a material bond, such as an adhesive bond, may be formed between the protective film and the wafer. The terms "material bond" and "adhesive bond" define an attachment or connection between protective film and wafer due to atomic and/or molecular forces acting between these two components.

The term "adhesive bond" relates to the presence of these atomic and/or molecular forces, which act so as to attach or adhere the protective film to the wafer, and does not imply the presence of an additional adhesive between protective film and wafer. Rather, at least the central area of the front surface of the protective film is in direct contact with the one side of the wafer or the side of the wafer being opposite to the one side, as has been detailed above.

By attaching the protective film to the wafer in this manner, any risk of contamination and damage to the wafer, in particular, the devices formed in the device area, can be further minimised.

Applying the external stimulus to the protective film may comprise or consist of heating the protective film and/or cooling the protective film and/or applying a vacuum to the protective film and/or irradiating the protective film with radiation, such as light, e.g., by using a laser beam.

The external stimulus may comprise or be a chemical compound and/or electron or plasma irradiation and/or mechanical treatment, such as pressure, friction or ultrasound application, and/or static electricity.

Particularly preferably, applying the external stimulus to the protective film comprises or consists of applying pressure to the protective film and/or heating the protective film.

For example, applying the external stimulus to the protective film may comprise or consist of heating the protective film and applying a vacuum to the protective film. In this case, the vacuum may be applied to the protective film during and/or before and/or after heating the protective film.

If applying the external stimulus to the protective film comprises or consists of heating the protective film, the method may further comprise allowing the protective film to cool down after the heating process. In particular, the protective film may be allowed to cool down to its initial temperature, i.e., to the temperature thereof prior to the heating process. The protective film may be allowed to cool down, e.g., to its initial temperature, before processing the wafer front side and/or the wafer back side.

An attachment force between protective film and wafer is generated through the heating process. The attachment of the protective film to the wafer may be caused in the heating process itself and/or in a subsequent process of allowing the protective film to cool down.

The protective film may be softened by the heating process, e.g., so as to conform to the wafer surface on the side of the wafer to which it is applied, for example, absorbing the wafer topography. Upon cooling down, e.g., to its initial temperature, the protective film may reharden, e.g., so as to create a form fit and/or a material bond to the wafer.

The protective film may be heat resistant up to a temperature of 180° C. or more, preferably up to a temperature of 220° C. or more, more preferably up to a temperature of 250° C. or more, and even more preferably up to a temperature of 300° C. or more.

The protective film may be heated to a temperature in the range of 30° C. to 250° C., preferably 50° C. to 200° C., more preferably 60° C. to 150° C. and even more preferably 70° C. to 110° C. Particularly preferably, the protective film is heated to a temperature of approximately 80° C.

The protective film may be heated over a duration in the range of 30 sec to 10 min, preferably 1 min to 8 min, more preferably 1 min to 6 min, even more preferably 1 min to 4 min and yet more preferably 1 min to 3 min, during and/or after applying the protective film to the wafer front or back side.

If applying the external stimulus to the protective film comprises or consists of heating the protective film, the protective film may be directly and/or indirectly heated.

The protective film may be heated by directly applying heat thereto, e.g., using a heat application means, such as a heated stamp, a heated roller or the like, or a heat radiation means. The protective film and the wafer may be placed in a receptacle or chamber, such as a vacuum chamber, and an inner volume of the receptacle or chamber may be heated, so as to heat the protective film. The receptacle or chamber may be provided with a heat radiation means.

The protective film may be indirectly heated, e.g., by heating the wafer before and/or during and/or after applying the protective film to the wafer front or back side. For example, the wafer may be heated by placing the wafer on a support or carrier, such as a chuck table, and heating the support or carrier.

For example, the support or carrier, such as a chuck table, may be heated to a temperature in the range of 30° C. to 250° C., preferably 50° C. to 200° C., more preferably 60° C. to 150° C. and even more preferably 70° C. to 110° C. Particularly preferably, the support or carrier may be heated to a temperature of approximately 80° C.

These approaches may also be combined, for example, by using a heat application means, such as a heated stamp, a heated roller or the like, or a heat radiation means for directly heating the protective film, and also indirectly heating the protective film through the wafer.

If applying the external stimulus to the protective film comprises or consists of heating the protective film, it is preferable that the protective film is pliable, elastic, flexible, stretchable, soft and/or compressible when in its heated state. In this way, it can be particularly reliably ensured that the protective film conforms to the wafer surface on the side of the wafer to which it is applied, for example, absorbing the wafer topography. This is especially advantageous if surface unevenness or roughness, such as grooves, trenches, bumps, optical elements or the like, is present on the respective side of the wafer.

Preferably, the protective film, at least to some degree, hardens or stiffens upon cooling down, so as to become more rigid and/or robust in the cooled down state. In this way, particularly reliable protection of the wafer during subsequent processing of the wafer, such as grinding and/or cutting the wafer, can be ensured.

The method may comprise, during and/or after applying the protective film to the wafer front or back side, applying pressure to a back surface of the protective film opposite to the front surface thereof. In this way, the front surface of the protective film is pressed against the respective side of the wafer. Thus, it can be particularly efficiently ensured that the protective film is reliably attached to the wafer.

If applying the external stimulus to the protective film comprises heating the protective film, the pressure may be applied to the back surface of the protective film before and/or during and/or after heating the protective film. The pressure may be applied to the back surface of the protective film before processing the front side and/or the back side of the wafer.

The pressure may be applied to the back surface of the protective film by a pressure application means, such as a stamp, a roller, a membrane or the like.

Particularly preferably, a combined heat and pressure application means, such as a heated stamp or a heated roller, may be used. In this case, pressure can be applied to the back surface of the protective film while, at the same time, heating the protective film.

The pressure may be applied to the back surface of the protective film in a vacuum chamber, as will be further detailed below. Since the at least a part of the peripheral portion of the protective film is attached to the at least a part of the lateral edge of the wafer along the entire circumference of the wafer, the wafer surface to which the protective film is attached is reliably sealed, so that any vacuum leakage at the peripheral wafer portion is prevented.

The protective film may be applied and/or attached to the front or back side of the wafer in a reduced pressure atmosphere, in particular, under a vacuum. In this way, it can be reliably ensured that no voids and/or air bubbles are present between the protective film and the wafer. Hence, any stress or strain on the wafer during processing the front side and/or the back side thereof, e.g., due to such air bubbles expanding in the heating process, is avoided.

For example, the step or steps of applying and/or attaching the protective film to the front or back side of the wafer may be carried out in a vacuum chamber. In particular, the protective film may be applied and/or attached to the respective side of the wafer by using a vacuum laminator. In such a vacuum laminator, the wafer is placed on a chuck table in a vacuum chamber in a state in which the side of the wafer to which the protective film is to be applied and/or attached is oriented upward and the other side of the wafer is in contact with an upper surface of the chuck table. The chuck table may be, for example, a heated chuck table.

The protective film to be applied to the wafer front or back side is held at its peripheral portion by an annular frame and placed above the respective wafer side in the vacuum chamber. An upper part of the vacuum chamber which is situated above the chuck table and the annular frame is provided with an air inlet port closed by an expandable rubber membrane.

After the wafer and the protective film have been loaded into the vacuum chamber, the chamber is evacuated and air is supplied through the air inlet port to the rubber membrane, causing the rubber membrane to expand into the evacuated chamber. In this way, the rubber membrane is moved downward in the vacuum chamber so as to push the protective film against the wafer front or back side, sealing the peripheral wafer portion with the protective film and pressing the film against the wafer. Hence, the protective film can be applied closely to the wafer front or back side, e.g., so as to follow the contours of protrusions or projections, if such protrusions or projections are present.

The protective film may be heated during and/or after application thereof to the front or back side of the wafer, e.g., by heating the chuck table.

Subsequently, the vacuum in the vacuum chamber is released and the protective film is held in its position on the wafer front or back side by the attachment force generated through the heating process and the positive pressure in the vacuum chamber.

Alternatively, the rubber membrane can be replaced by a stamp or a roller, e.g., a heated stamp or a heated roller. In particular, a soft stamp or a soft roller may be used.

The method may further comprise removing the protective film from the wafer after processing the front side and/or the back side thereof. Before and/or during removal of the protective film from the wafer, an external stimulus, such as heat, may be applied to the protective film. In this way, the removal process can be facilitated.

The wafer may further have, on the front side thereof, a peripheral marginal area having no devices and being formed around the device area.

The wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the wafer may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

The wafer may have any type of shape. In a top view thereon, the wafer may have, for example, a circular shape, an oval shape, an elliptical shape or a polygonal shape, such as a rectangular shape or a square shape.

The protective film may have any type of shape. In a top view thereon, the protective film or sheet may have, for example, a circular shape, an oval shape, an elliptical shape or a polygonal shape, such as a rectangular shape or a square shape.

The protective film may have substantially the same shape or the same shape as the wafer.

The protective film may have an outer diameter which is larger than an outer diameter of the wafer. In this way, processing, handling and/or transport of the wafer can be facilitated. In particular, the radially outermost part of the peripheral portion of the protective film can be attached to an annular frame, as will be detailed below.

The protective film may have an outer diameter which is substantially the same as the outer diameter of the wafer.

The protective film may have an outer diameter which is smaller than the outer diameter of the wafer. For example, the lateral wafer edge may have a radially outwardly curved surface profile. In this case, the outer diameter of the wafer is determined at the apex of the curved surface. If the at least a part of the peripheral portion of the protective film is to be attached to the at least a part of the lateral edge of the wafer along only part of the thickness of the wafer, the outer diameter of the protective film may be chosen so as to be smaller than that of the wafer.

The protective film may have an outer diameter which is larger than the outer diameter of the device area but smaller than the outer diameter of the wafer.

The method may further comprise cutting the protective film. The protective film may be cut so that it has an outer diameter which is larger than the outer diameter of the wafer or smaller than the outer diameter of the wafer or substantially the same as the outer diameter of the wafer.

The step of cutting the protective film may be performed before or after applying the protective film to the wafer.

The step of cutting the protective film may be performed before or after attaching the protective film to the wafer.

The step of cutting the protective film may be performed, for example, by mechanical cutting, e.g., using a blade or a saw, laser cutting or plasma cutting.

In particular, the method may comprise a step of cutting off portions of the protective film which radially extend beyond the circumference of the wafer. For example, this step may be carried out before grinding the wafer back side. Cutting off these portions can facilitate handling of the wafer in subsequent processing steps, in particular, back side grinding. In this way, the processing space required for the grinding step can be reduced, thus further enhancing the processing efficiency.

The portions of the protective film radially extending beyond the circumference of the wafer may be cut off so that at least a part of the peripheral portion of the protective film remains attached to at least a part of the lateral edge of the wafer along the entire circumference of the wafer. In this way, it can be reliably ensured that the wafer is also safely protected in subsequent processing steps.

The method may further comprise attaching the radially outermost part of the peripheral portion of the protective film to an annular frame. In particular, this part may be attached to the annular frame so that the protective film closes a central opening of the annular frame, i.e., the area inside the inner diameter of the annular frame. In this way, the wafer, which is attached to the protective film, in particular, to a central portion thereof, is held by the annular frame through the protective film. Thus, a wafer unit, comprising the wafer, the protective film and the annular frame, is formed, facilitating processing, handling and/or transport of the wafer.

The radially outermost part of the peripheral portion of the protective film may be attached to the annular frame, for example, by an adhesive, by a mechanical fixation means, such as a plurality of clamps or the like, or by heat welding the protective film to the frame.

The step of attaching the radially outermost part of the peripheral portion of the protective film to the annular frame may be performed before or after applying the protective film to the wafer.

The step of attaching the radially outermost part of the peripheral portion of the protective film to the annular frame may be performed before or after attaching the protective film to the wafer.

The step of attaching the radially outermost part of the peripheral portion of the protective film to the annular frame may be performed before or after processing the front side and/or the back side of the wafer.

At least one division line may be formed on the one side of the wafer. A plurality of division lines may be formed on the one side of the wafer. The one or more division lines partition the devices formed in the device area.

The width of the at least one division line may be in the range of 30 µm to 200 µm, preferably 30 µm to 150 µm and more preferably 30 µm to 100 µm.

The method may comprise processing the one side of the wafer, i.e., the wafer front side. Processing the one side of the wafer may comprise or consist of removing wafer material along the at least one division line. If a plurality of division lines is formed on the one side of the wafer, processing the one side of the wafer may comprise or consist of removing wafer material along each of the plurality of division lines.

The wafer material may be removed along the at least one division line from the one side of the wafer before applying the protective film to the one side of the wafer or to the side of the wafer being opposite to the one side.

The wafer material may be removed along the at least one division line throughout the entire thickness of the wafer. In this case, the wafer is divided along the at least one division line into a plurality of chips or dies by the wafer material removal process.

Alternatively, the wafer material may be removed along the at least one division line along only part of the thickness of the wafer. For example, the wafer material may be removed along 20% or more, 30% or more, 40% or more, 50% or more, 60% or more, 70% or more, 80% or more, or 90% or more of the thickness of the wafer.

In this case, a process of dividing, i.e., fully dividing, the wafer may be carried out, for example, by adopting a breaking process, applying an external force to the wafer, e.g., using an expansion tape, or by adopting a cutting or dicing process, such as a mechanical cutting or dicing process, a laser cutting or dicing process or a plasma cutting or dicing process. For example, an external force may be applied to the wafer by radially expanding the protective film, i.e., by using the protective film as an expansion tape. Further, also a combination of two or more of these processes may be employed.

Moreover, the wafer may be divided by grinding the side of the wafer being opposite to the one side, as will be further detailed below.

The process of removing wafer material along the at least one division line may be performed so that, in the plane of the wafer, wafer material is removed all the way to the lateral edge of the wafer, or so that no wafer material is removed in a peripheral portion of the wafer, for example, in the peripheral marginal area.

The partial removal of wafer material along the at least one division line results in the formation of at least one groove or trench in the wafer surface. Conventionally, such grooves or trenches can cause problems in subsequent wafer processing steps, such as back side grinding, in particular, if they extend all the way to the lateral edge of the wafer. Due to the presence of the at least one groove or trench, a protective film attached to the processed wafer surface in a conventional manner after such partial wafer material removal may not reliably seal the wafer surface at the peripheral wafer portion, allowing contaminants, such as debris, grinding water or cutting water, to enter in the peripheral wafer area or areas where the at least one groove or trench is present and to contaminate the wafer surface. Since, in the method of the present invention, the at least a part of the peripheral portion of the protective film is attached to the at least a part of the lateral edge of the wafer along the entire circumference of the wafer, the protective film reliably seals the respective wafer surface at the peripheral wafer portion, even in the presence of such grooves or trenches, thus safely preventing contamination of the wafer.

The method may comprise processing the side of the wafer being opposite to the one side. The protective film may be applied and attached to the one side of the wafer. Processing the side of the wafer being opposite to the one side may comprise grinding the side of the wafer being opposite to the one side to adjust the wafer thickness.

The method of the invention provides particularly reliable and efficient protection of the wafer in such a grinding process, as has been detailed above. In particular, the wafer front side is safely sealed by the protective film, preventing the entry of contaminants, such as grinding debris and grinding water. Further, the protective film reliably protects the peripheral wafer portion from damage, e.g., wafer chipping or breakage. Therefore, the wafer can be ground to small thicknesses at high speed, while minimising the risk of damage to the wafer. If a sharp wafer edge is formed during the grinding process, it is safely protected by the protective film.

Wafer material may be removed along the at least one division line from the one side of the wafer along only part of the thickness of the wafer before applying the protective film to the one side of the wafer, as has been detailed above. Subsequently, after attaching the protective film to the one side of the wafer, the side of the wafer being opposite to the one side may be ground. This grinding step may be performed along a remaining part of the thickness of the wafer in which no wafer material has been removed, so as to divide the wafer along the at least one division line.

By dividing the wafer in the grinding step in this way, the wafer can be processed in a particularly reliable, accurate and efficient manner. Specifically, the step of removing wafer material along the at least one division line is performed on the wafer before grinding, i.e., before a reduction in thickness thereof. Hence, any deformation of the wafer during material removal, e.g., during cutting, along the at least one division line, such as wafer warpage or the like, can be reliably avoided. Further, the stress applied to the wafer during wafer material removal along the at least one division line is significantly reduced, allowing for chips or dies with an increased die strength to be obtained. Any damage to the resulting chips or dies, such as the formation of cracks or back side chipping, can be prevented.

Moreover, since the wafer material is removed along the at least one division line along only part of the wafer thickness, the efficiency, in particular, the processing speed, of the wafer material removal process is enhanced. Also, the service life of a means, e.g., a cutting means, used for the wafer material removing step is extended.

The wafer material may be mechanically removed along the at least one division line. In particular, the wafer material may be removed along the at least one division line by mechanically cutting the wafer along the at least one division line, e.g., by blade dicing or sawing. In this case, the wafer is cut from the front side thereof.

Alternatively or in addition, the wafer material may be removed along the at least one division line by laser cutting and/or by plasma cutting.

The wafer may be cut in a single mechanical cutting step, a single laser cutting step or a single plasma cutting step. Alternatively, the wafer may be cut by a sequence of mechanical cutting and/or laser cutting and/or plasma cutting steps.

Laser cutting may be performed, for example, by ablation laser cutting and/or by stealth laser cutting, i.e., by forming modified regions within the wafer by the application of a laser beam, as will be further detailed below, and/or by forming a plurality of hole regions in the wafer by the application of a laser beam. Each of these hole regions may be composed of a modified region and a space in the modified region open to a surface of the wafer.

By having the protective film attached to the wafer, e.g., the wafer back side, it can be ensured that the pressure applied during the cutting step is more uniformly and homogeneously distributed throughout the wafer during cutting, thus reducing or even minimising any risk of damage to the wafer, e.g., cracking of the sidewalls of the resulting chips or dies, in the cutting step.

The method may comprise processing the one side of the wafer, wherein processing the one side of the wafer comprises or consists of applying a pulsed laser beam to the wafer from the one side of the wafer, the wafer is made of a material which is transparent to the pulsed laser beam, and the pulsed laser beam is applied to the wafer at least in a plurality of positions along the at least one division line, in a condition where a focal point of the pulsed laser beam is located at a distance from the one side of the wafer in the direction from the one side of the wafer towards the side of the wafer being opposite to the one side, so as to form a plurality of modified regions in the wafer along the at least one division line.

In this case, the wafer is made of a material which is transparent to the pulsed laser beam. Thus, the plurality of modified regions is formed in the wafer by the application of a pulsed laser beam having a wavelength that allows transmission of the laser beam through the wafer. For example, if the wafer is a Si wafer, the pulsed laser beam may have a wavelength of 1.0 μm or more.

The protective film may be attached to the wafer front or back side. If the protective film is attached to the wafer front side, the pulsed laser beam is applied to the wafer through the protective film. Thus, a protective film is used that is made of a material which is transparent to the pulsed laser beam.

The pulsed laser beam may have a pulse width, for example, in the range of 1 ns to 300 ns.

The modified regions may comprise amorphous regions or regions in which cracks are formed, or may be amorphous regions or regions in which cracks are formed. In particularly preferred embodiments, the modified regions comprise or are amorphous regions.

Each modified region may comprise a space, e.g., a cavity, inside the wafer material, the space being surrounded by an amorphous region or a region in which cracks are formed.

Each modified region may be composed of a space, e.g., a cavity, inside the wafer material and an amorphous region or a region in which cracks are formed surrounding the space.

If the modified regions comprise or are regions in which cracks are formed, i.e., cracks have been formed, the cracks may be microcracks. The cracks may have dimensions, e.g., lengths and/or widths, in the μm range. For example, the cracks may have widths in the range of 5 μm to 100 μm and/or lengths in the range of 100 μm to 1000 μm.

According to this method, the pulsed laser beam is applied to the wafer from the one side of the wafer at least in a plurality of positions along the at least one division line, so as to form a plurality of modified regions in the wafer along the at least one division line. By forming these modified regions, the strength of the wafer in the areas thereof where the modified regions are formed is reduced. Hence, division of the wafer along the at least one division line where the plurality of modified regions has been formed is greatly facilitated. In such a wafer division process, the individual devices provided in the device area of the wafer are obtained as chips or dies.

The method may further comprise, after forming the plurality of modified regions in the wafer, dividing the wafer along the at least one division line. The process of dividing the wafer may be carried out in various ways, e.g., by adopting a breaking process, applying an external force to the wafer, for example, using an expansion tape, or by adopting a cutting or dicing process, such as a mechanical cutting or dicing process, a laser cutting or dicing process or a plasma cutting or dicing process. For example, an external force may be applied to the wafer by radially expanding the protective film, i.e., by using the protective film as an expansion tape. Further, also a combination of two or more of these processes may be employed.

The method may comprise processing the side of the wafer being opposite to the one side. Processing the side of the wafer being opposite to the one side may comprise or consist of applying a pulsed laser beam to the wafer from the side of the wafer being opposite to the one side, wherein the wafer is made of a material which is transparent to the pulsed laser beam, and the pulsed laser beam is applied to the wafer at least in a plurality of positions along the at least one division line, in a condition where a focal point of the pulsed laser beam is located at a distance from the side of the wafer being opposite to the one side in the direction from the side of the wafer being opposite to the one side towards the one side of the wafer, so as to form a plurality of modified regions in the wafer along the at least one division line.

The protective film may be attached to the wafer front or back side. If the protective film is attached to the wafer back side, the pulsed laser beam is applied to the wafer through the protective film. Thus, a protective film is used which is made of a material which is transparent to the pulsed laser beam.

The pulsed laser beam applied from the back side of the wafer may be the same pulsed laser beam as applied from the front side of the wafer or a different pulsed laser beam.

The modified regions formed by applying the pulsed laser beam from the back side of the wafer may be formed substantially in the same manner as the modified regions formed by applying the pulsed laser beam from the front side of the wafer.

The protective film may be applied to the one side of the wafer or to the side of the wafer being opposite to the one side so that, in the entire region where the front surface of the protective film is in contact with the one side of the wafer or the side of the wafer being opposite to the one side, the front surface of the protective film is in direct contact with the one side of the wafer or the side of the wafer being opposite to the one side. Thus, no material, in particular, no adhesive, is present between the front surface of the protective film and the one side of the wafer or the side of the wafer being opposite to the one side.

In this way, the risk of a possible contamination of or damage to the wafer, e.g., due to an adhesive force of an adhesive layer or adhesive residues on the wafer, can be reliably eliminated.

Alternatively, the protective film may be provided with an adhesive layer, wherein the adhesive layer is provided only in a peripheral area of the front surface of the protective film, the peripheral area surrounding the central area of the front surface of the protective film, and the protective film is applied to the one side of the wafer or to the side of the wafer being opposite to the one side so that the adhesive layer comes into contact only with a peripheral portion of the one side of the wafer or a peripheral portion of the side of the wafer being opposite to the one side and/or only with the at least a part of the lateral edge of the wafer. The peripheral portion of the one side of the wafer may be the peripheral marginal area. The peripheral portion of the side of the wafer being opposite to the one side may correspond to the peripheral marginal area formed on the one side of the wafer.

The adhesive layer may come into contact only with the peripheral portion of the one side of the wafer or the peripheral portion of the side of the wafer being opposite to the one side and with the at least a part of the lateral edge of the wafer. The adhesive layer may come into contact only with the at least a part of the lateral edge of the wafer.

In this way, the attachment of the protective film to the wafer can be further improved. Since the adhesive layer is provided only in the peripheral area of the front surface of the protective film, the area in which protective film and wafer are attached to each other by the adhesive layer is significantly reduced as compared to a case where an adhesive layer is provided on the entire front surface of the protective film. Thus, the protective film can be detached from the wafer more easily and the risk of damage to the wafer, in particular, to protrusions formed on the front or back side thereof, is considerably reduced.

The adhesive of the adhesive layer may be curable by an external stimulus, such as heat, UV radiation, an electric field and/or a chemical agent. In this way, the protective film can be particularly easily removed from the wafer after processing. The external stimulus may be applied to the adhesive so as to lower the adhesive force thereof, thus allowing for an easy removal of the protective film.

For example, the adhesive layer may have a substantially annular shape, an open rectangular shape or an open square shape, i.e., a rectangular or square shape, respectively, with an opening in the centre of the adhesive layer.

The protective film may be expandable. The protective film may be expanded when being applied to the one side of the wafer or to the side of the wafer being opposite to the one side. If protrusions or projections are present on the respective side of the wafer, the protective film may be expanded when being applied to the wafer so as to closely or at least partly follow the contours of these protrusions.

In particular, the protective film may be expandable to twice its original size or more, preferably three times its original size or more and more preferably four times its original size or more. In this way, in particular, for the case of an expansion to three or four times its original size or more, it can be reliably ensured that the protective film follows the contours of the protrusions.

If the protective film is expandable it may be used for separating the devices from each other. In particular, the method may further comprise, after processing the one side of the wafer and/or the side of the wafer being opposite to the one side, radially expanding the protective film so as to separate the devices from each other.

For example, the wafer may be fully divided, e.g., by a mechanical cutting process, a laser cutting process or a plasma cutting process, or by a dicing before grinding process. Subsequently, the fully divided devices, which may be in the form of chips or dies, may be moved away from each other by radially expanding the protective film, thereby increasing the distances between adjacent devices.

Alternatively, the wafer may be subjected to a stealth dicing process, i.e., a process in which modified regions are formed within the wafer by the application of a laser beam, as has been detailed above. Subsequently, the wafer may be divided, e.g., broken, along the at least one division line where the modified regions are formed by radially expanding the protective film, thereby obtaining individual chips or dies.

As an alternative to radially expanding the protective film, a separate expansion tape may be attached to the wafer back side, e.g., after removing the protective film. Subsequently, the devices may be separated from each other by radially expanding the expansion tape.

The protective film may be made of a single material, in particular, a single homogeneous material.

The protective film may be made of a plastic material, such as a polymer. Particularly preferably, the protective film is made of a polyolefin. For example, the protective film may be made of polyethylene (PE), polypropylene (PP) or polybutylene (PB).

Polyolefin films have material properties which are especially advantageous for use in the wafer processing method of the present invention, in particular, if an external stimulus is applied to the protective film and applying the external stimulus comprises or consists of heating the protective film. Polyolefin films are pliable, stretchable and soft when in a heated state, e.g., when heated to a temperature in the range of 60° C. to 150° C. Thus, it can be particularly reliably ensured that the protective film conforms to the wafer surface on the side of the wafer to which it is applied, for example, absorbing the wafer topography. This is particularly beneficial if the respective wafer side is formed with protrusions or projections protruding from a plane surface of the wafer.

Further, polyolefin films harden and stiffen upon cooling down, so as to become more rigid and robust in the cooled down state. Hence, particularly reliable protection of the wafer during subsequent processing of the wafer, such as grinding and/or cutting the wafer, can be ensured.

The protective film may have a thickness in the range of 5 to 200 µm, preferably 8 to 100 µm, more preferably 10 to 80 µm and even more preferably 12 to 50 µm. Particularly preferably, the protective film has a thickness in the range of 80 to 150 µm.

In this way, it can be particularly reliably ensured that the protective film is flexible and pliable enough to sufficiently conform to the contours of protrusions formed on the wafer side to which it is applied, if such protrusions are present, and, at the same time, exhibits a sufficient thickness in order to reliably and efficiently protect the wafer during processing the front side and/or the back side thereof.

A cushioning layer may be attached to a back surface of the protective film opposite to the front surface thereof.

This approach is particularly advantageous if protrusions or projections, such as surface unevenness or roughness, bumps, optical elements, e.g., optical lenses, other structures or the like, protrude, extend or project from the side of the wafer to which the protective film is applied. In this case, the protrusions or projections define a surface structure or topography of the respective wafer side, rendering this side uneven.

Such protrusions or projections, e.g., bumps, in particular, on the wafer front side, may be used, for example, for establishing an electrical contact with the devices in individual chips or dies after the wafer has been divided, e.g., when incorporating the chips or dies in electronic equipment, such as mobile phones and personal computers.

The protrusions may be irregularly arranged or arranged in a regular pattern. Only some of the protrusions may be arranged in a regular pattern.

The protrusions may have any type of shape. For example, some or all of the protrusions may be in the shape of spheres, semi-spheres, pillars or columns, e.g., pillars or columns with a circular, elliptic or polygonal, such as triangular, square etc., cross-section or base area, cones, truncated cones or steps.

At least some of the protrusions may arise from elements formed on the plane surface of the wafer. At least some of the protrusions may arise from elements partly or entirely penetrating the wafer in its thickness direction, e.g., for the case of a through silicon via (TSV). These latter elements may extend along part of the wafer thickness or along the entire wafer thickness.

The protrusions may have a height in the thickness direction of the wafer in the range of 20 to 500 μm, preferably 30 to 400 μm, more preferably 40 to 250 μm, even more preferably 50 to 200 μm and yet even more preferably 70 to 150 μm.

All the protrusions may have substantially the same shape and/or size. Alternatively, at least some of the protrusions may differ from each other in shape and/or size.

If the cushioning layer is attached to the back surface of the protective film, such protrusions or projections can be embedded in the cushioning layer. Hence, any negative influence of the surface unevenness arising from the presence of the protrusions on subsequent wafer processing steps, such as grinding and/or cutting, can be eliminated. In particular, the cushioning layer can significantly contribute to achieving a particularly uniform and homogeneous distribution of pressure during grinding and cutting processes.

By embedding the protrusions in the cushioning layer, the protrusions, such as, for example, bumps, optical elements or other structures, are reliably protected from any damage during wafer processing, for example, in a subsequent grinding or cutting step.

Further, if the wafer is ground to a small thickness in a grinding step, e.g., a thickness in the μm range, protrusions present on the wafer front side, e.g., in the device area, may cause a deformation of the wafer back side, due to the reduced thickness of the wafer and the pressure applied thereto in the grinding process. This latter effect is referred to as "pattern transfer", since the pattern of the protrusions on the wafer front side is transferred to the wafer back side, and results in an undesired unevenness of the back side surface of the wafer, thus compromising the quality of the resulting chips or dies.

The protective film and the cushioning layer act as a cushion or buffer between the wafer front side and, for example, a support or carrier on which the wafer front side rests during processing, e.g., grinding and/or polishing, the wafer back side, thus contributing to achieving a uniform and homogeneous distribution of pressure during processing. Hence, a pattern transfer or breakage of the wafer during processing, in particular, grinding, the back side thereof can be particularly reliably prevented.

The material of the cushioning layer is not particularly limited. In particular, the cushioning layer may be formed of any type of material which allows for protrusions protruding along the thickness direction of the wafer to be embedded therein. For example, the cushioning layer may be formed of a resin, an adhesive, a gel or the like.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the method of the invention are ResiFlat by the DISCO Corporation and TEMPLOC by DENKA.

The method may further comprise applying the external stimulus to the cushioning layer so as to cure the cushioning layer, before processing, e.g., grinding or cutting, the wafer. In this way, the protection of the wafer during grinding and/or cutting and the grinding and/or cutting accuracies can be further improved.

The cushioning layer may be heat resistant up to a temperature of 180° C. or more, preferably up to a temperature of 220° C. or more, more preferably up to a temperature of 250° C. or more, and even more preferably up to a temperature of 300° Co r more.

The cushioning layer may have a thickness in the range of 10 to 300 μm, preferably 20 to 250 μm and more preferably 50 to 200 μm.

The cushioning layer may be attached to the back surface of the protective film before applying the protective film to the one side of the wafer or to the side of the wafer being opposite to the one side.

In this case, the protective film and the cushioning layer may be laminated first, forming a protective sheeting comprising the cushioning layer and the protective film attached to the cushioning layer. The protective sheeting formed in this manner may be subsequently applied to the one side of the wafer or to the side of the wafer being opposite to the one side, e.g., such that protrusions or projections protruding from the plane surface of the wafer are covered by the protective film and embedded in the protective film and the cushioning layer. The protective sheeting may be applied so that the back surface of the cushioning layer is substantially parallel to the side of the wafer which is opposite to the wafer side to which the protective sheeting is applied. The front surface of the protective film is applied to the one side of the wafer or to the side of the wafer being opposite to the one side when the protective sheeting is applied to the one side of the wafer or to the side of the wafer being opposite to the one side.

In this way, the wafer processing method can be carried out in a particularly simple and efficient manner. For example, the protective sheeting can be prepared in advance, stored for later use and used for wafer processing when required. The protective sheeting may thus be manufactured in large quantities, rendering the production thereof particularly efficient in terms of both time and cost.

The cushioning layer may be attached to the back surface of the protective film after applying or after attaching the protective film to the one side of the wafer or to the side of the wafer being opposite to the one side.

In this case, the protective film is applied or applied and attached to the one side of the wafer or to the side of the wafer being opposite to the one side first, and the wafer side having the protective film applied thereto is subsequently attached to the front surface of the cushioning layer, e.g., so that protrusions or projections protruding from the plane surface of the wafer are embedded in the protective film and the cushioning layer, and the back surface of the cushioning layer is substantially parallel to the side of the wafer which is opposite to the wafer side to which the protective film and the cushioning layer are attached. This approach allows for the protective film to be attached to the one side of the wafer or to the side of the wafer being opposite to the one side with a particularly high degree of accuracy, in particular, in relation to protrusions or projections protruding from the plane surface of the wafer.

The cushioning layer may be attached to the back surface of the protective film before and/or during and/or after attaching the protective film to the one side of the wafer or to the side of the wafer being opposite to the one side.

The method may further comprise removing the protective film and the cushioning layer from the wafer. The protective film and the cushioning layer may be removed from the wafer after processing, such as grinding and/or cutting, the wafer.

The cushioning layer and the protective film may be removed individually, i.e., one after the other. For example, the cushioning layer may be removed first, followed by the removal of the protective film. Alternatively, the cushioning layer and the protective film may be removed together.

A base sheet may be attached to the back surface of the cushioning layer opposite to the front surface thereof which is attached to the protective film.

The material of the base sheet is not particularly limited. The base sheet may be made of a soft or pliable material, such as, for example, a polymer material, e.g., polyvinyl chloride (PVC), ethylene vinyl acetate (EVA) or a polyolefin.

Alternatively, the base sheet may be made of a rigid or hard material, such as polyethylene terephthalate (PET) and/or silicon and/or glass and/or stainless steel (SUS).

For example, if the base sheet is made of polyethylene terephthalate (PET) or glass and the cushioning layer is curable by an external stimulus, the cushioning layer may be cured with radiation that is transmittable through polyethylene terephthalate (PET) or glass, for instance UV radiation. If the base sheet is made of silicon or stainless steel (SUS), a cost-efficient base sheet is provided.

Also, the base sheet may be formed of a combination of the materials listed above.

The base sheet may be heat resistant up to a temperature of 180° C. or more, preferably up to a temperature of 220° C. or more, more preferably up to a temperature of 250° C. or more, and even more preferably up to a temperature of 300° C. or more.

The base sheet may have a thickness in the range of 30 to 1500 μm, preferably 40 to 1200 μm and more preferably 50 to 1000 μm.

The cushioning layer and the base sheet may be attached to the back surface of the protective film before or after applying the protective film to the front or back side of the wafer. In particular, the protective film, the cushioning layer and the base sheet may be laminated first, forming a protective sheeting comprising the base sheet, the cushioning layer and the protective film attached to the cushioning layer. The protective sheeting formed in this manner may be subsequently applied to the wafer front or back side.

The front surface of the base sheet may be in contact with the back surface of the cushioning layer, and a back surface of the base sheet opposite to the front surface thereof may be substantially parallel to the side of the wafer which is opposite to the wafer side to which the protective film, the cushioning layer and the base sheet are applied. Thus, when processing, e.g., grinding and/or cutting, the wafer, a suitable counter pressure can be applied to the back surface of the base sheet, e.g., by placing this back surface on a chuck table.

In this case, since the plane back surface of the base sheet is substantially parallel to the side of the wafer which is opposite to the wafer side to which the protective film, the cushioning layer and the base sheet are applied, pressure applied to the wafer during processing, such as grinding and/or cutting processes, e.g., by a grinding wheel of a grinding apparatus and/or by a cutting or dicing blade of a cutting apparatus, is more evenly and homogeneously distributed over the wafer, thus minimising any risk of breakage of the wafer. Further, the substantially parallel alignment of the flat, even back surface of the base sheet and the respective side of the wafer allows for grinding and cutting steps to be carried out with a high degree of precision, thus achieving the production of high quality dies or chips with well-defined shapes and sizes.

The method may further comprise polishing and/or etching, e.g., plasma etching, the side of the wafer being opposite to the one side, in particular, after grinding the side of the wafer being opposite to the one side.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to a method of processing a wafer W (see FIGS. 1 and 2).

Figure 1:
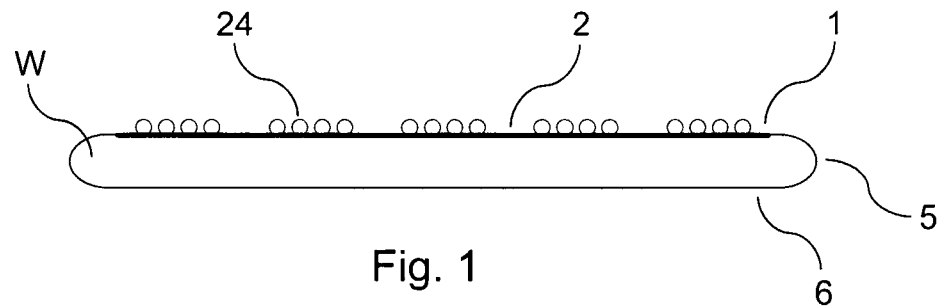
FIG. 1 is a cross-sectional view showing a wafer to be processed by a method of the present invention.

The wafer W can be, for example, a MEMS wafer having MEMS devices formed on the surface of a front side 1 thereof (see FIG. 1). However, the wafer W is not limited to a MEMS wafer but may also be a CMOS wafer having CMOS devices, preferably as solid-state imaging devices, formed on the front side 1 thereof or a wafer with other types of devices on the front side 1.

The wafer W may be made of a semiconductor, e.g., silicon (Si). Such a silicon wafer W can include devices, such as ICs (integrated circuits) and LSIs (large scale integrations), on a silicon substrate. Alternatively, the wafer may be an optical device wafer configured by forming optical devices, such as LEDs (light emitting diodes), on an inorganic material substrate of, for example, ceramic, glass or sapphire. The wafer W is not limited to this and can be formed in any other way. Furthermore, also a combination of the above described exemplary wafer designs is possible.

The wafer W can have a thickness before grinding in the μm range, preferably in the range of 625 to 925 μm.

The wafer W preferably exhibits a circular shape. However, the shape of the wafer W is not particularly limited. In other embodiments, the wafer W may have, for example, an oval shape, an elliptical shape or a polygonal shape, such as a rectangular shape or a square shape.

The wafer W is provided with a plurality of crossing division lines 11 (see FIG. 2), also termed streets, formed on the front side 1 thereof, thereby partitioning the wafer W into a plurality of rectangular regions where devices 27, such as those described above, are respectively formed. These devices 27 are formed in a device area 2 of the wafer W. In the case of a circular wafer W, the device area 2 is preferably circular and arranged concentrically with the outer circumference of the wafer W. The wafer W further has a back side 6 opposite to the front side 1 (see FIG. 1).

Moreover, the wafer W has a lateral edge 5 (see FIGS. 1 and 2) extending from the front side 1 to the back side 6, thus forming a circumferential side surface of the wafer W. The lateral edge 5 has a radially outwardly curved, i.e., convex, surface profile, as is shown in FIG. 1. In particular, the lateral edge 5 extends from a surface plane of the front side 1 to a surface plane of the back side 6 in a curved manner. The extension directions of the lateral edge 5 thus deviate from and intersect the surface planes of the front and back sides 1, 6 of the wafer W.

Figure 2:
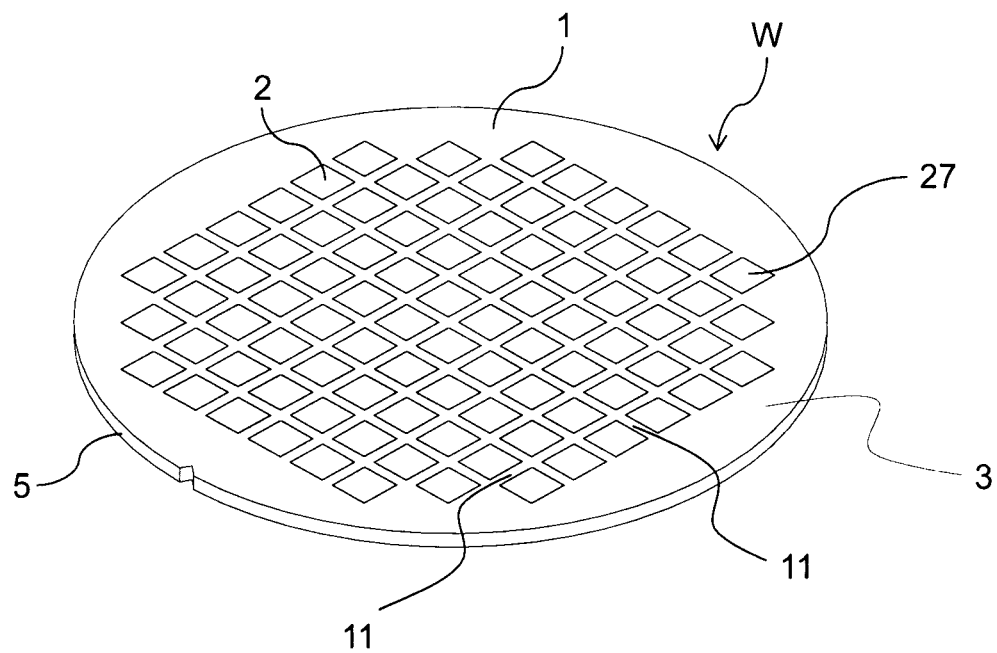
FIG. 2 is a perspective view of the wafer shown in FIG. 1.

The device area 2 is surrounded by an annular peripheral marginal area 3, as is schematically shown in FIG. 2. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The device area 2 of the wafer W is formed with a plurality of protrusions 24 protruding from a plane surface of the wafer W (see FIG. 1). The protrusions 24 may be, for example, bumps for establishing an electrical contact with the devices 27 of the device area 2 in the separated chips or dies. The height of the protrusions 24 in the thickness direction of the wafer W may be in the range of 20 to 500 μm.

In FIG. 2, the protrusions 24 have been omitted for better presentability.

In the following, a method of processing a wafer W according to a first embodiment of the present invention will be described with reference to FIGS. 1 to 10B.

FIG. 1 shows a cross-sectional view of the wafer W to be processed by the method of the present invention. FIG. 2 shows a perspective view of the wafer W shown in cross-section in FIG. 1.

Figure 3:
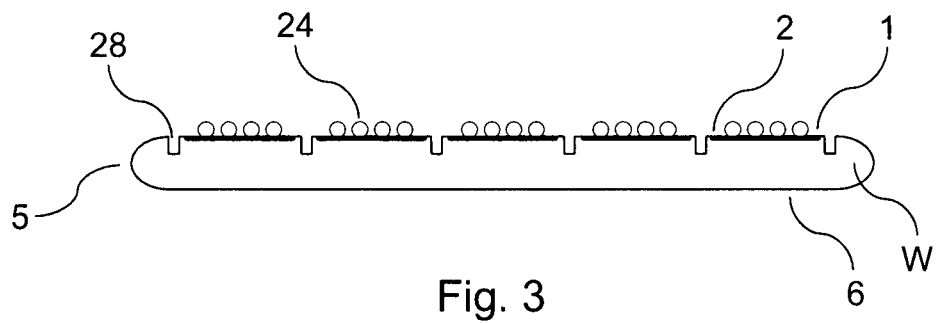
FIG. 3 is a cross-sectional view showing the outcome of a step of removing wafer material in a method of processing the wafer according to the present invention.

In the method of this embodiment, as a first step, wafer material is removed along the division lines 11 (see FIGS. 4A and 4B) from the front side 1 of the wafer W. In this process, wafer material is removed along only a part of the thickness of the wafer W so as to form grooves 28 extending along the division lines 11, as is shown in FIGS. 3, 4A and 4B.

The wafer material may be removed along the division lines 11 in the manner detailed above. In particular, the wafer material may be mechanically removed along the division lines 11. For example, the wafer material may be removed along the division lines 11 by mechanically cutting the wafer W along the division lines 11, e.g., by blade dicing or sawing. Alternatively or in addition, the wafer material may be removed along the division lines 11 by laser cutting, e.g., ablation laser grooving, and/or by plasma cutting.

Figures 4A, 4B:
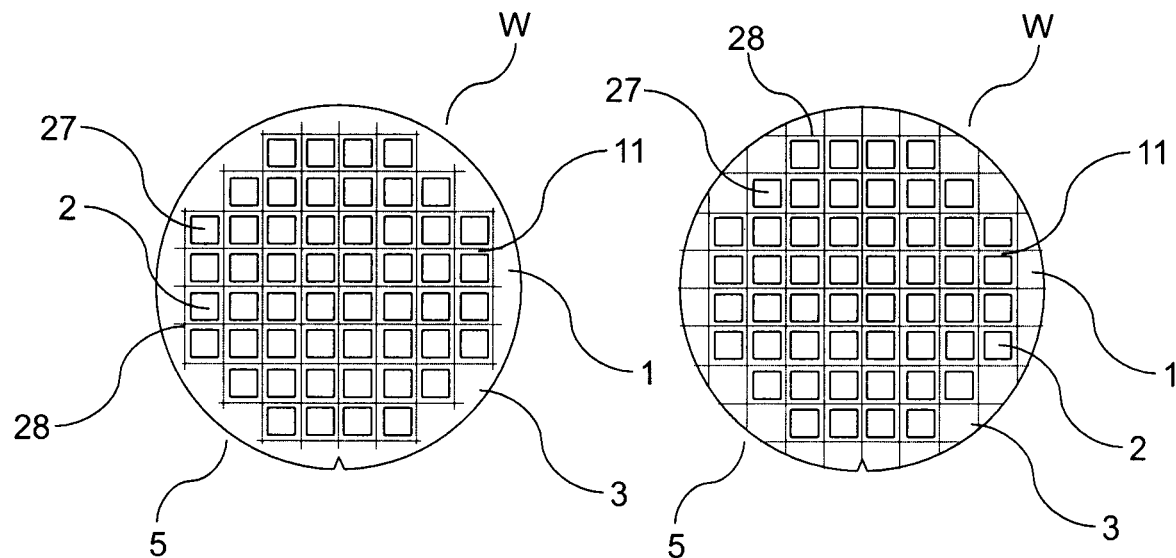
FIG. 4A is a top view of the wafer showing the outcome of a modified step of removing wafer material.
FIG. 4B is a top view of the wafer shown in FIG. 3.

As is shown in FIG. 4A, the process of removing wafer material along the division lines 11 may be performed so that the grooves 28 do not extend all the way to the lateral edge 5 of the wafer W. In this case, no wafer material is removed in a peripheral portion of the wafer W, i.e., the peripheral Portion remains uncut. The extension of this uncut peripheral wafer portion may be, for example, approximately 3 to 5 mm in the radial directions of the wafer W. In this way, the device area 2 can be particularly reliably protected against contamination. In particular, a protective film can be attached to the peripheral portion of the wafer W in especially close contact to the wafer surface, thus improving the efficiency of sealing the device area 2.

However, performing the process of removing wafer material in this manner may cause a reduction of the number of chips or dies obtainable from the wafer W, in particular, for the case of chips or dies with small sizes, due to the presence of the uncut peripheral wafer portion. Moreover, if the wafer W is divided by a grinding process, as will be explained in detail below, the uncut peripheral wafer portion remains after grinding and has to be removed in an additional processing step, thus affecting the processing efficiency.

Therefore, in view of the above considerations, it is preferable to perform the process of removing wafer material along the division lines 11 so that the grooves 28 extend all the way to the lateral edge 5 of the wafer W, as is shown in FIG. 4B. In this way, the surface area of the front side 1 can be fully exploited, allowing for the number of chips or dies that can be obtained from the wafer W to be maximised. Further, the wafer W can be fully divided in a subsequent grinding process, without the need of any additional processing steps.

In conventional wafer processing methods, the extension of the grooves 28 up to the lateral wafer edge 5 may cause problems in following processing steps, such as back side grinding. In particular, these grooves 28 may provide entry points for contaminants, such as debris, grinding water or cutting water. Hence, the front side 1, in particular, the device area 2, may be contaminated during further processing of the wafer W, thus affecting the quality of the resulting chips or dies. These problems have been overcome by the processing method of the present invention, as has been detailed above and will be further explained in the following for the first embodiment.

In the method of the first embodiment, wafer material is removed along the division lines 11 so that the grooves 28 extend all the way to the lateral edge 5 of the wafer W (see FIG. 4B). However, as a modification of this first embodiment, the wafer material may be removed in the manner shown in FIG. 4A. Also in this latter case, the method of the present invention provides particularly efficient and reliable protection of the wafer W against contamination and damage.

Figure 5:
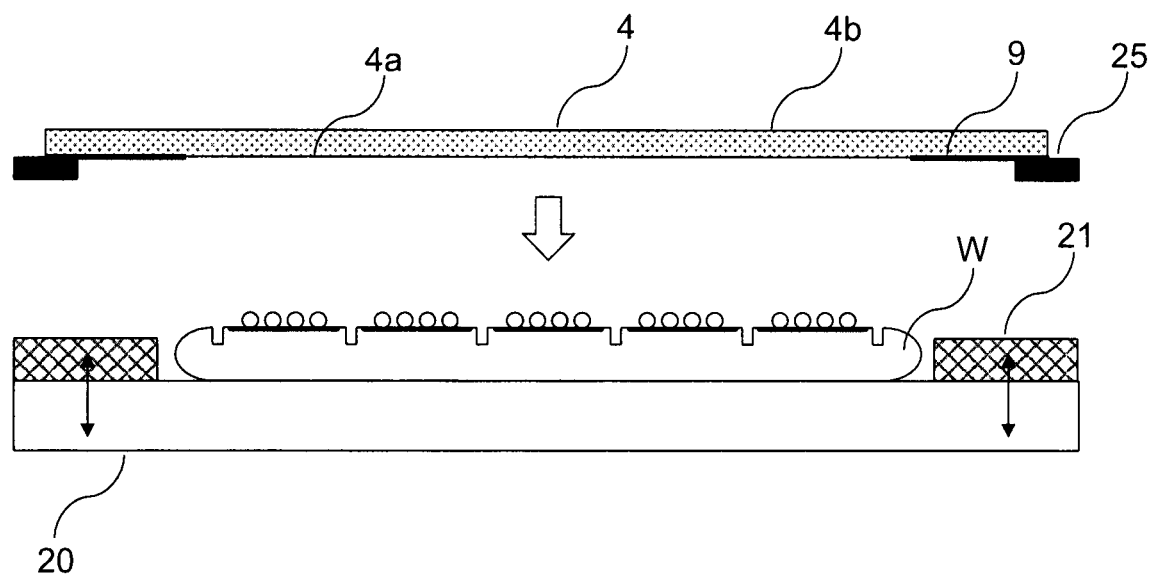
FIG. 5 is a cross-sectional view illustrating a step of applying a protective film to the wafer shown in FIGS. 1 to 3 and 4B in a method of processing the wafer according to a first embodiment of the present invention.

After removing the wafer material along the division lines 11 in the manner detailed above and illustrated in FIGS. 3 and 4B, a protective film 4, for covering the devices 27 on the wafer W, is applied to the front side 1 of the wafer W (see FIG. 5). An adhesive layer 9 is applied to a part of a front surface 4a of the protective film 4 opposite to a back surface 4b thereof. The adhesive layer 9 has an annular shape and is provided only in a circumferential or peripheral area of the front surface 4a of the protective film 4. The circumferential or peripheral area surrounds a central area of the front surface 4a of the protective film 4 in which no adhesive is present. The adhesive layer 9 has been omitted in FIGS. 7 to 10B for simplicity.

As is shown in FIG. 5, the protective film 4 has an outer diameter which is larger than an outer diameter of the wafer W. The annular adhesive layer 9 has an outer diameter which is larger than the inner diameter of an annular frame 25. Further, the annular adhesive layer 9 has an inner diameter which is smaller than the outer diameter of the wafer W but larger than the outer diameter of the device area 2. Hence, it can be reliably ensured that the adhesive of the adhesive layer 9 comes into contact only with the peripheral marginal area 3 on the front side 1 of the wafer W and with a part of the lateral wafer edge 5.

Before applying the protective film 4 to the wafer W, an outermost part of a peripheral portion of the protective film 4 is mounted on the annular frame 25. This part of the protective film 4 is attached to the annular frame 25 by means of the adhesive layer 9. The back side 6 of the wafer W is placed on a chuck table 20 (see FIG. 5) so that the wafer front side 1 is oriented upwards. Preferably, the chuck table 20 is arranged in a vacuum chamber (not shown) so that the protective film 4 can be applied and attached to the wafer W under vacuum. The chuck table 20 is provided with an annular spacer 21 arranged at a peripheral portion of the chuck table 20. The annular spacer 21 is movable up and down in the vertical direction, e.g., by means of a motor or a spring mechanism (not shown), as is indicated by solid arrows in FIG. 5. The wafer W is placed on the chuck table 20 so as to be disposed inside a central opening of the annular spacer 21. The wafer W may be held on the chuck table 20, for example, by vacuum suction.

Subsequently, as is indicated by an arrow in FIG. 5, the protective film 4 is applied to the front side 1 of the wafer W placed on the chuck table 20, thereby applying the front surface 4a of the protective film 4 to the front side 1 and to a part of the lateral wafer edge 5. The protective film 4 is applied to the wafer front side 1 so that the central area of the front surface 4a of the protective film 4, i.e., the area of the front surface 4a inside the annular adhesive layer 9, is in direct contact with the front side 1. Thus, no material, in particular, no adhesive, is present between the central area of the front surface 4a of the protective film 4 and the front side 1 of the wafer W.

Figure 6:
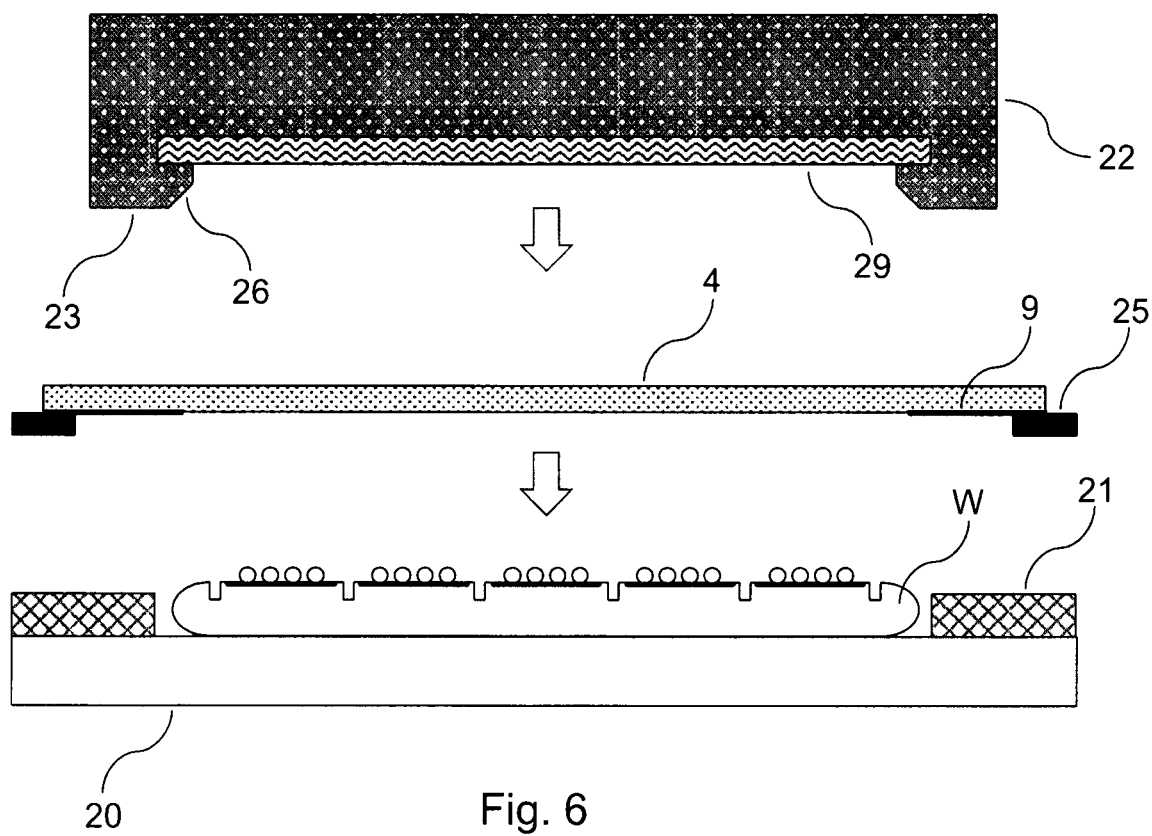
FIG. 6 is a cross-sectional view illustrating a step of attaching the protective film to the wafer in the method according to the first embodiment.

The protective sheeting 4 is attached to the wafer front side 1 by applying pressure to the back surface 4b of the protective sheeting 4, as is illustrated by the upper arrow in FIG. 6, thereby pressing the protective film 4 against the front side 1 and the part of the lateral wafer edge 5. For this purpose, a pressure application means in the form of a pressing stamp 22 (see FIGS. 6 and 7) is used. Preferably, the pressing stamp 22 is arranged in a vacuum chamber (not shown) together with the chuck table 20.

The pressing stamp 22 has an annular pressing protrusion 23 for pressing the protective sheeting 4 against the front side 1 and the part of the lateral wafer edge 5. The annular pressing protrusion 23 has a rounded or tapered inner circumference portion 26 for particularly efficiently pressing the protective sheeting 4 against the part of the lateral wafer edge 5.

Further, optionally, the pressing stamp 22 may be provided with a stimulus application means 29 for applying an external stimulus to the protective film 4. For example, the stimulus application means 29 may be a heat radiation means for applying heat to the protective film 4 and/or an irradiation means for irradiating the protective film 4 with radiation, such as light.

Figure 7:
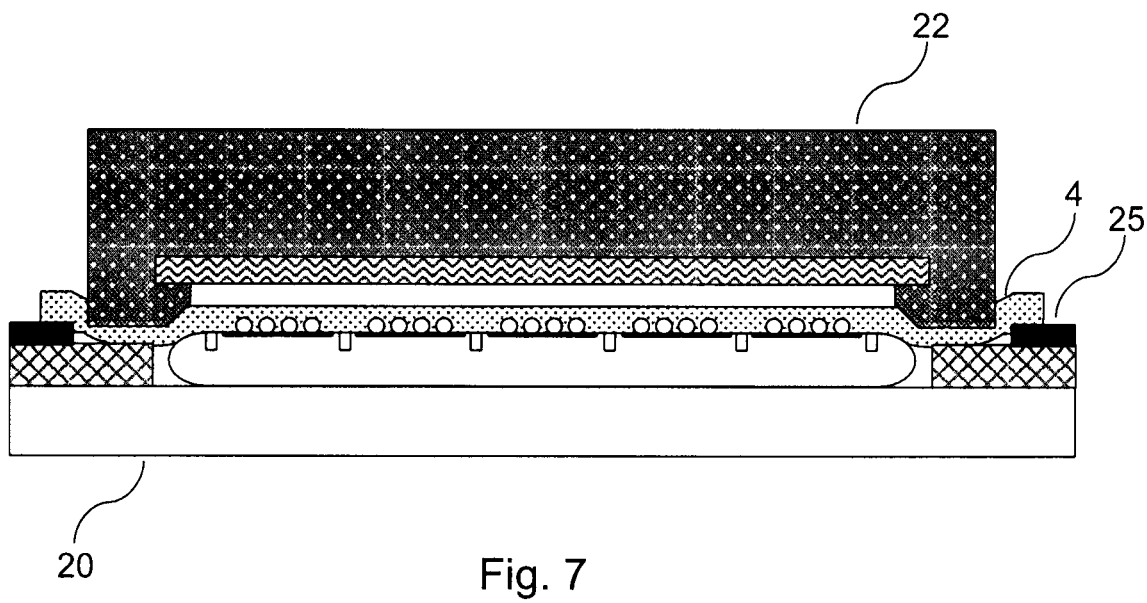
FIG. 7 is a cross-sectional view showing the outcome of the attaching step shown in FIG. 6.

By pressing the protective film 4 against the wafer W, the protective film 4 is attached to the peripheral marginal area 3 and to the part of the lateral wafer edge 5 by the adhesive layer 9. Specifically, a part of the peripheral portion of the protective film 4 is attached to the part of the lateral edge 5 along the entire circumference of the wafer W. Further, the protrusions 24 protruding on the front side 1 of the wafer W are embedded in the protective film 4. The outcome of this attaching step is shown in FIG. 7.

In the attaching step detailed above, the annular pressing protrusion 23 of the pressing stamp 22 cooperates with the annular spacer 21. In particular, an upper surface of the annular spacer 21 serves as support for part of the peripheral portion of the protective film 4 when the protective film 4 is pressed against the wafer W by the pressing stamp 22. Since the annular spacer 21 is movable up and down in the vertical direction, the vertical position of the upper spacer surface can be suitably adjusted to the thickness and the shape of the wafer W to be processed. Preferably, the upper surface of the spacer 21, which comes into contact with the adhesive layer 9 of the protective film 4, is provided with a non-stick coating so that the protective film 4 can be particularly easily removed from the spacer 21 after attachment to the wafer W.

The protective film 4 covers the protrusions 24, thus protecting them against damage or contamination. Further, the protective film 4 acts as an additional cushion or buffer in a subsequent grinding step, as will be detailed below. Since the part of the peripheral portion of the protective film 4 is attached to the part of the lateral wafer edge 5 along the entire circumference of the wafer W, the protective film 4 reliably seals the wafer front side 1 at the peripheral wafer portion. Hence, despite the grooves 28 extending all the way to the lateral edge 5, contaminants, such as debris, grinding water or cutting water, are prevented from entering and contaminating the front surface 1, in particular, the device area 2.

The adhesive forming the adhesive layer 9 may be curable by an external stimulus, such as heat, UV radiation, an electric field and/or a chemical agent. In this way, the protective film 4 can be particularly easily removed from the wafer W after processing.

In particular, the adhesive may be an acrylic resin or an epoxy resin. A preferred example of a UV curable-type resin for the adhesive is, e.g., urethane acrylate oligomer.

Further, the adhesive may be, for example, a water soluble resin.

The protective film 4 is made of a polyolefin. For example, the protective film 4 may be made of polyethylene (PE), polypropylene (PP) or polybutylene (PB). The protective film 4 may have a thickness in the range of 5 to 200 µm.

The protective film 4 is pliable and extendable to approximately three times its original diameter. When applying the protective film 4 to the wafer W, the protective film 4 is expanded, e.g., to approximately three times its original diameter, so as to follow the contours of the protrusions 24.

Further, optionally, during and/or after applying the protective film 4 to the front side 1 of the wafer W, an external stimulus may be applied to the protective film 4 so that the protective film 4 is fully attached to the front side 1. In particular, this step may be performed by the stimulus application means 29, if present.

Applying the external stimulus to the protective film 4 may comprise or consist of heating the protective film 4 and/or cooling the protective film 4 and/or applying a vacuum to the protective film 4 and/or irradiating the protective film 4 with radiation, such as light, e.g., by using the stimulus application means 29 in the form of a light irradiation means.

The external stimulus may comprise or be a chemical compound and/or electron or plasma irradiation and/or mechanical, treatment, such as pressure, friction or ultrasound application, and/or static electricity.

Particularly preferably, applying the external stimulus to the protective film 4 comprises or consists of heating the protective film 4. For example, applying the external stimulus to the protective film 4 may comprise or consist of heating the protective film 4 and applying a vacuum to the protective film 4, e.g., in a vacuum chamber (not shown). In this case, the vacuum may be applied to the protective film 4 during and/or before and/or after heating the protective film 4.

In particular, the protective film 4 may be heated by heating the chuck table 20 (see FIGS. 5 to 7), e.g., to a temperature in the range of 60° C. to 150° C. Particularly preferably, the chuck table 20 is heated to a temperature of approximately 80° C. The chuck table 20 may be heated, for example, over a duration in the range of 1 min to 10 min. In addition to heating the protective film 4 through the heated chuck table 20, or as an alternative thereto, heat may be applied to the protective film 4 by using the stimulus application means 29 in the form of a heat application means, in particular, a heat radiation means.

By heating the protective film 4, using the heated chuck table 20 and/or the stimulus application means 29, the protective film 4 is fully attached to the front side 1 of the wafer W.

Specifically, an attachment force between the central area of the front surface 4a of the protective film 4 and the front side 1 of the wafer W is generated through the heating process. In particular, by heating the protective film 4, a form fit and/or a material bond is formed between protective film 4 and wafer W in this central area.

Further, the peripheral area of the front surface 4a of the protective film 4 is adhered to the peripheral portion of the front side 1 of the wafer W and to the part of the lateral wafer edge 5 by the adhesive layer 9, thus ensuring a particularly robust and reliable attachment of the protective film 4 with a high sealing efficiency.

In a modification of the first embodiment, the adhesive layer 9 may be omitted. In this case, the protective film 4 is applied to the front side 1 of the wafer W so that, in the entire region where the front surface 4a of the protective film 4 is in contact with the wafer front side 1 and the lateral wafer edge 5, the front surface 4a of the protective film 4 is in direct contact with the front side 1 and the lateral edge 5. Thus, no material, in particular, no adhesive, is present between the front surface 4a of the protective film 4 and the front side 1 and the lateral edge 5. In this way, the risk of a possible contamination of or damage to the wafer W, e.g., due to an adhesive force of an adhesive layer or adhesive residues on the wafer W, can be particularly reliably eliminated. In this case, the protective film 4 may be attached to the wafer W by the application of an external stimulus, as has been detailed above.

Figure 8:
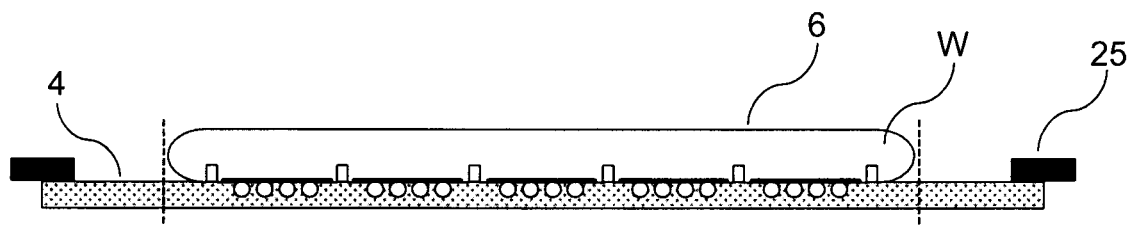
FIG. 8 is a cross-sectional view illustrating a step of cutting off a portion of the protective film in the method according to the first embodiment.

After attaching the protective film 4 to the wafer W in the manner illustrated in FIGS. 6 and 7, portions of the protective film 4 which radially extend beyond the circumference of the wafer W are cut off, as is indicated by dashed lines in FIG. 8. This cutting step may be performed, for example, by mechanical cutting, e.g., using a blade or a saw, laser cutting or plasma cutting. Cutting off these portions facilitates handling of the wafer W in the subsequent grinding step. In particular, the processing space required for the grinding process can be reduced, thus further enhancing the processing efficiency.

Figures 10A, 10B:
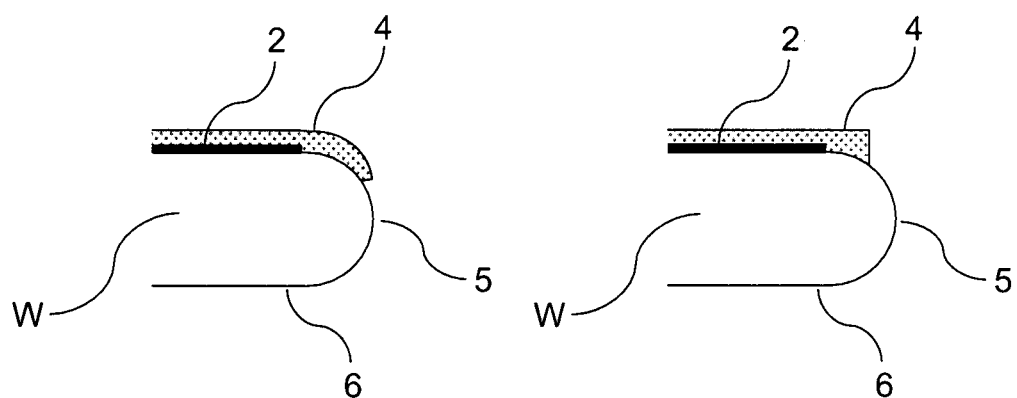
FIG. 10A is an enlarged cross-sectional view showing a peripheral portion of the wafer after the attaching step shown in FIG. 6.
FIG. 10B is an enlarged cross-sectional view showing a peripheral portion of the wafer after a modified attaching step.

The portions of the protective film 4 radially extending beyond the circumference of the wafer W are cut off so that the part of the peripheral portion of the protective film 4 remains attached to the part of the lateral edge 5 of the wafer W along the entire circumference of the wafer W, as is shown in FIG. 10A. In this way, it is reliably ensured that the wafer W is safely protected in the following grinding process.

The part of the peripheral portion of the protective film 4 is attached to the part of the lateral edge 5 along only part of the thickness of the wafer W, namely approximately 20% of the thickness of the wafer W (see FIG. 10A). This part of the thickness of the wafer W is chosen so that it is smaller than the thickness of the wafer W to be obtained in the subsequent grinding process. Thus, it is ensured that the grinding equipment (not shown), such as a grinding wheel, does not come into contact with the protective film 4 during grinding. Hence, any damage to this equipment, such as clogging of the grinding wheel, can be reliably prevented.

FIG. 10B shows the peripheral portion of the wafer W according to a modification of the method of the first embodiment. In this modification, the protective film 4 has an outer diameter which is larger than the outer diameter of the device area 2 but smaller than the outer diameter of the wafer W. Thus, the part of the peripheral portion of the protective film 4 is attached to the part of the lateral edge 5 along a smaller part of the thickness of the wafer W as compared to the arrangement shown in FIG. 10A, namely approximately 10% of the thickness of the wafer W.

Figure 9:
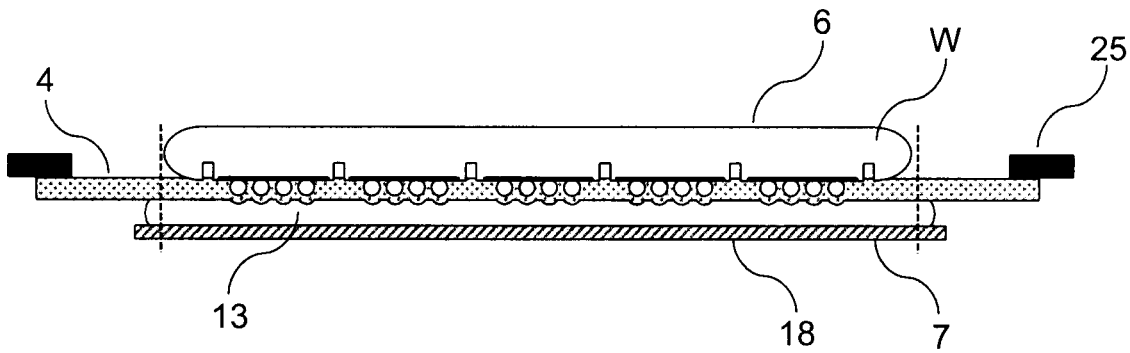
FIG. 9 is a cross-sectional view illustrating a step of cutting off a portion of the protective film in a method according to a modification of the first embodiment.

A further modification of the method of the first embodiment is shown in FIG. 9. In this modification, a cushioning layer 13 and a base sheet 7 are attached to the protective film 4 after attaching the protective film 4 to the wafer W. Specifically, the cushioning layer 13 is attached to the back surface 4b of the protective film 4 and the base sheet 7 is attached to a back surface of the cushioning layer 13. Thus, a front surface of the cushioning layer 13 is in contact with the back surface 4b of the protective film 4, and the back surface of the cushioning layer 13 is in contact with a front surface of the base sheet 7.

The base sheet 7 and the cushioning layer 13 have a substantially circular shape. The outer diameters of the base sheet 7 and the cushioning layer 13 are larger than the outer diameter of the wafer W but smaller than the outer diameter of the protective film 4. The outer diameter of the base sheet 7 is slightly larger than the outer diameter of the cushioning layer 13.

For example, the base sheet 7 may have a thickness in the range of 500 to 1000 µm. The cushioning layer 13 may have a thickness, e.g., in the range of 10 to 300 µm, preferably 50 to 200 µm.

The material of the cushioning layer 13 is not particularly limited. In particular, the cushioning layer 13 may be formed of any type of material which allows for the protrusions 24 to be embedded therein. For example, the cushioning layer 13 may be formed of a resin, an adhesive, a gel or the like.

The material of the base sheet 7 is not particularly limited. The base sheet 7 may be made of a soft or pliable material, such as, for example, a polymer material, e.g., polyvinyl chloride (PVC), ethylene vinyl acetate (EVA) or a polyolefin.

Alternatively, the base sheet 7 may be made of a rigid or hard material, such as polyethylene terephthalate (PET) and/or silicon and/or glass and/or stainless steel (SUS).

The cushioning layer 13 is curable by an external stimulus, such as UV radiation, heat, an electric field and/or a chemical agent. In particular, the cushioning layer 13 may be formed of a curable resin, such as ResiFlat by DISCO Corporation or TEMPLOC by DENKA.

The cushioning layer 13 and the base sheet 7 are attached to the protective film 4 so that the protrusions 24 are embedded in the cushioning layer 13 and a back surface 18 of the base sheet 7 is substantially parallel to the back side 6 of the wafer W (see FIG. 9). The step of attaching the cushioning layer 13 and the base sheet 7 to the protective film 4 can be carried out, for example, in a vacuum mounter (not shown), such as a vacuum chamber, e.g., in the same vacuum chamber in which the protective film 4 has been attached to the wafer W.

After attaching the cushioning layer 13 and the base sheet 7 to the protective film 4, an external stimulus is applied to the cushioning layer 13 so as to cure, in particular, harden, the cushioning layer 13. For example, for the case of a heat curable, e.g., thermosetting, cushioning layer 13, the cushioning layer 13 may be cured by heating. For the case of a UV curable cushioning layer 13, the cushioning layer 13 is cured by the application of UV radiation, e.g., through the base sheet 7, if a base sheet material is used which is transparent to this type of radiation, such as PET or glass.

Hence, the protrusions 24 are firmly held in the cured cushioning layer 13 and the substantially parallel relative alignment of the base sheet back surface 18 and the wafer back side 6 is particularly reliably maintained throughout further wafer processing, in particular, back side grinding.

It is to be noted, however, that the step of curing the cushioning layer 13 described above is optional. Alternatively, the cushioning layer 13 may be formed of a non-curable material, such as a non-curable adhesive, a non-curable resin or a non-curable gel, or the cushioning layer 13 may be formed of a curable material but not be cured in the method of processing the wafer W.

The protective film 4 covers the protrusions 24 formed on the front side 1 of the wafer W, therefore protecting the protrusions 24 from damage and contamination, e.g., also from residues of the material forming the cushioning layer 13. Moreover, the protective film 4 functions as an additional cushion or buffer between the front side 1 of the wafer W and the cushioning layer 13, thus further contributing to the uniform and homogeneous distribution of pressure during further processing, such as grinding. Hence, breakage of the wafer W during the grinding process can be particularly reliably prevented.

After attaching the cushioning layer 13 and the base sheet 7 to the protective film 4 and after curing the cushioning layer 13, if such a curing step is performed, portions of the protective film 4, the cushioning layer 13 and the base sheet 7 which radially extend beyond the circumference of the wafer W are cut off, as is indicated by dashed lines in FIG. 9. This cutting step may be performed, for example, by mechanical cutting, e.g., using a blade or a saw, laser cutting or plasma cutting. Cutting off these portions facilitates handling of the wafer W in the subsequent grinding step, as has been detailed above.

Subsequently, after cutting the protective film 4 as shown in FIG. 8 or cutting the protective film 4, the cushioning layer 13 and the base sheet 7 as shown in FIG. 9, the back side 6 of the wafer W is ground to adjust the wafer thickness. Grinding the wafer back side 6 is performed along a remaining part of the thickness of the wafer W in which no wafer material has been removed, so as to divide the wafer W along the division lines 11, thereby obtaining individual chips or dies.

The protective film 4 reliably protects the wafer W, in particular, the peripheral wafer portion, from contamination and damage, e.g., wafer chipping or breakage, in the grinding process. Thus, the wafer W can be ground to small thicknesses at high speed, while minimising the risk of damage to the wafer W. If a sharp wafer edge is formed during the grinding process, it is safely protected by the protective film 4. Hence, it can be reliably ensured that the wafer W, the chips or dies resulting after division of the wafer W, and the equipment used for grinding the wafer W are not compromised in their integrity. No additional processing step, such as edge trimming the wafer W prior to grinding, is required, so that a high processing efficiency can be achieved. Further, since the part of the peripheral portion of the protective film 4 is attached to the part of the lateral edge 5 of the wafer W along the entire circumference of the wafer W (see FIGS. 10A and 10B), the protective film 4 reliably seals the wafer front side 1 at the peripheral wafer portion, thus preventing contaminants, such as grinding debris and grinding water, from entering and contaminating the wafer surface, in particular, the device area 2, during the grinding process.

After grinding the back side 6 of the wafer W, the back side 6 may be polished and/or etched, e.g., plasma etched.

In a subsequent step, an expandable adhesive tape (not shown), such as an expansion tape, may be attached to the ground back side 6 of the wafer W. A peripheral portion of the adhesive tape may be mounted on an annular frame, such as the annular frame 25 shown in FIGS. 5 to 9.

After the adhesive tape has been attached to the ground wafer back side 6, the protective film 4 or the protective film 4, the cushioning layer 13 and the base sheet 7, if the latter two layers are present, may be removed. The adhesive tape may then be radially expanded, e.g., by using an expansion drum or the like, so as to move the divided chips or dies away from each other, thereby increasing the distances between adjacent chips or dies. Subsequently, the chips or dies may be picked up, e.g., by using a pick-up device (not shown).

Alternatively, the chips or dies may be picked up directly from the protective film 4. Before such a pick-up step, the base sheet 7 and the cushioning layer 13, if present, may be removed from the divided wafer W together, so that the chips or dies remain on the protective film 4. In this way, the separated dies or chips can be picked up from the protective film 4 in a particularly simple and efficient manner. For example, the protective film 4 may be radially expanded, using an expansion drum or the like, thereby increasing a gap between adjacent chips or dies and thus facilitating the pick-up process.

The cushioning layer 13 may exhibit a degree of compressibility, elasticity and/or flexibility, e.g., a rubber-like behavior, after curing, thus allowing for a particularly easy removal thereof from the wafer W. Alternatively or additionally, another external stimulus, such as hot water, may be applied to the cured cushioning layer 13 prior to removal thereof, in order to soften the cured cushioning layer 13 for further facilitating the removal process.

In the following, a method of processing the wafer W according to a second embodiment of the present invention will be described with reference to FIGS. 11 and 12.

In the description of the second embodiment, the elements which are similar or identical to those of the first embodiment are denoted by the same reference signs and a repeated detailed description thereof is omitted.

Figure 11:
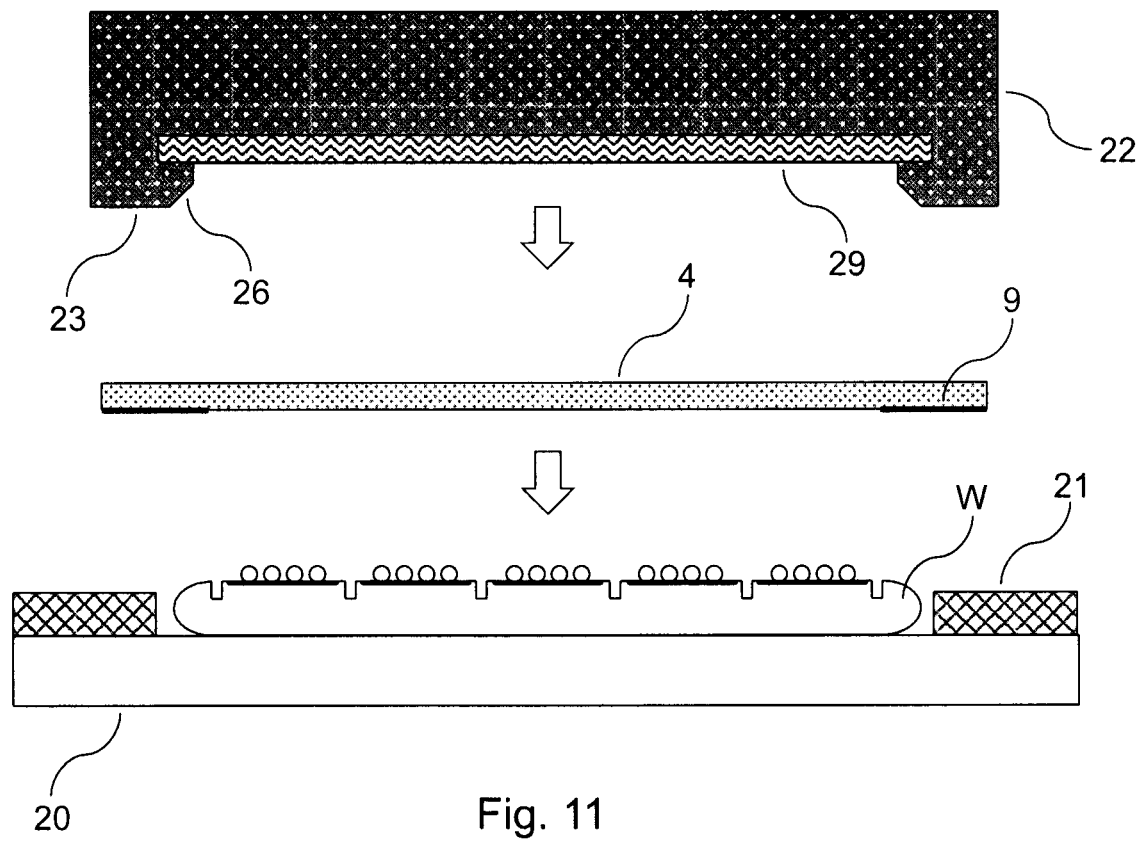
FIG. 11 is a cross-sectional view illustrating a step of attaching the protective film to the wafer in a method according to a second embodiment of the present invention.
Figure 12:
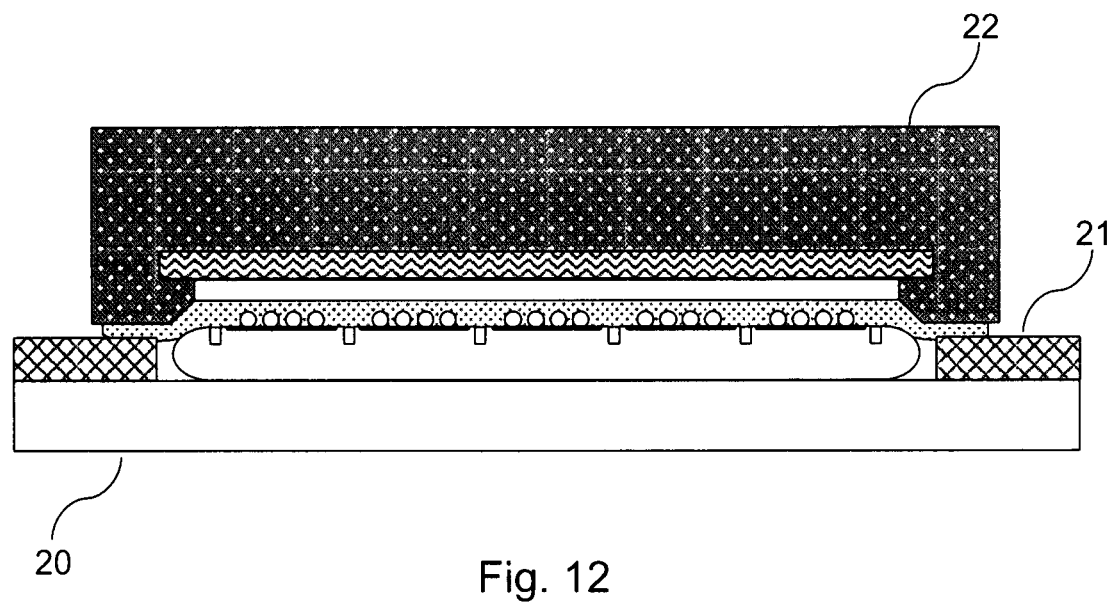
FIG. 12 is a cross-sectional view showing the outcome of the attaching step shown in FIG. 11.

The wafer processing method according to the second embodiment substantially only differs from the wafer processing method according to the first embodiment in that the annular frame 25 is omitted (see FIGS. 11 and 12). Further, in the second embodiment, the outer diameter of the protective film 4 is smaller than in the first embodiment.

In particular, the outer diameter of the protective film 4 of the second embodiment is smaller than the outer diameter of the pressing stamp 22. However, also the outer diameter of the protective film 4 of the second embodiment is larger than the outer diameter of the wafer W, as is shown in FIGS. 11 and 12. It is to be noted that, in FIG. 12, the adhesive layer 9 has been omitted for simplicity.

Omitting the annular frame 25 may offer the advantage that, at least for some processing steps, less processing space is required, e.g., for accommodating and/or handling the wafer W, thus further enhancing the processing efficiency.

The above disclosure of the wafer processing method according to the first embodiment also fully applies to the wafer processing method according to the second embodiment. Each of the processing steps described above for the first embodiment may also be performed substantially in the same manner in the method of the second embodiment.

While, in the methods of the first and second embodiments, the protective film 4 has been applied and attached to the wafer front side 1, the protective film 4 may instead be applied and attached to the wafer back side 6 substantially in the same manner. Such an approach is particularly advantageous if protrusions, such as surface unevenness or roughness, bumps, optical elements or the like, protruding along the thickness direction of the wafer W are present on the wafer back side 6. Also for the case of applying the protective film 4 to the wafer back side 6, the above disclosure of the wafer processing methods according to the first and second embodiments fully applies.

The invention claimed is:

1. A method of processing a wafer, having on one side a device area with a plurality of uncut devices, wherein the method comprises:
   providing a protective film;
   applying the protective film to the one side of the wafer or to the side of the wafer being opposite to the one side, so that at least a central area of a front surface of the protective film is in direct contact with the one side of the wafer or the side of the wafer being opposite to the one side;
   attaching the protective film to the one side of the wafer or to the side of the wafer being opposite to the one side, so that at least a part of a peripheral portion of the protective film is attached to at least a part of a lateral edge of the wafer along the entire circumference of the wafer, wherein the lateral edge of the wafer extends from the one side of the wafer to the side of the wafer being opposite to the one side; and
   processing the one side of the wafer and/or the side of the wafer being opposite to the one side.

2. The method according to claim 1, wherein attaching the protective film to the one side of the wafer or to the side of the wafer being opposite to the one side comprises applying an external stimulus to the protective film during and/or after applying the protective film to the one side of the wafer or to the side of the wafer being opposite to the one side.

3. The method according to claim 2, wherein applying the external stimulus to the protective film comprises heating the protective film and/or cooling the protective film and/or applying a vacuum to the protective film and/or irradiating the protective film with light.

4. The method according to claim 1, wherein
   the protective film is provided with an adhesive layer,
   the adhesive layer is provided only in a peripheral area of the front surface of the protective film, the peripheral area surrounding the central area of the front surface of the protective film, and
   the protective film is applied to the one side of the wafer or to the side of the wafer being opposite to the one side so that the adhesive layer comes into contact only with a peripheral portion of the one side of the wafer or a peripheral portion of the side of the wafer being opposite to the one side and/or only with the at least a part of the lateral edge of the wafer.

5. The method according to claim 4, wherein the adhesive layer has a substantially annular shape, an open rectangular shape or an open square shape.

6. The method according to claim 1, wherein
   at least one division line is formed on the one side of the wafer,
   the method comprises removing wafer material along the at least one division line from the one side of the wafer before applying the protective film to the one side of the wafer or to the side of the wafer being opposite to the one side, and the wafer material is removed along only a part of the thickness of the wafer.

7. The method according to claim 6, wherein the protective film is applied and attached to the one side of the wafer, the method comprises processing the side of the wafer being opposite to the one side, processing the side of the wafer being opposite to the one side comprises grinding the side of the wafer being opposite to the one side to adjust the wafer thickness, and grinding the side of the wafer being opposite to the one side is performed along a remaining part of the thickness of the wafer in which no wafer material has been removed, so as to divide the wafer along the at least one division line.

8. The method according to claim 1, wherein a cushioning layer is attached to a back surface of the protective film opposite to the front surface thereof.

9. The method according to claim 8, wherein a base sheet is attached to a back surface of the cushioning layer.

10. The method according to claim 1, wherein the protective film is made of a polymer, in particular, a polyolefin.

* * * * *